(12) United States Patent
Nakayama (10) Patent No.: US 11,719,744 B2
(45) Date of Patent: Aug. 8, 2023

(54) INSPECTION APPARATUS, CONTROL METHOD, AND STORAGE MEDIUM

(71) Applicant: Tokyo Electron Limited, Tokyo (JP)

(72) Inventor: Hiroyuki Nakayama, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 17/573,680

(22) Filed: Jan. 12, 2022

(65) Prior Publication Data

US 2022/0229105 A1 Jul. 21, 2022

(30) Foreign Application Priority Data

Jan. 19, 2021 (JP) ................................. 2021-006267

(51) Int. Cl.
*G01R 31/28* (2006.01)

(52) U.S. Cl.
CPC ..... *G01R 31/2874* (2013.01); *G01R 31/2831* (2013.01); *G01R 31/2867* (2013.01)

(58) Field of Classification Search
CPC ................ G01R 31/28; G01R 31/2601; G01R 31/2644; G01R 31/2831; G01R 31/2867; G01R 31/2874; G01K 1/026; G01K 1/14; G01K 3/02; G05D 23/00
USPC ......................................... 324/754.1, 750.03
See application file for complete search history.

(56) References Cited

U.S. PATENT DOCUMENTS

2009/0076763 A1* 3/2009 Okamura .......... H01L 21/67248
374/45

FOREIGN PATENT DOCUMENTS

JP     H10124766 A * 5/1998 ............. G08B 17/06
JP     2009-021311 A     1/2009

OTHER PUBLICATIONS

Espacenet translate JPH10124766A (Year: 1998).*

* cited by examiner

*Primary Examiner* — Lee E Rodak
*Assistant Examiner* — Courtney G McDonnough
(74) *Attorney, Agent, or Firm* — Armstrong Teasdale LLP (57) ABSTRACT

An inspection apparatus includes: an acquisition part configured to acquire first coordinate information indicating a position of an inspection object on a stage and a plurality of pieces of second coordinate information indicating positions of a plurality of temperature sensors on the stage when performing an inspection of the inspection object; a calculation part configured to calculate a Mahalanobis distance between a position specified by an average vector of the first coordinate information and the positions of the plurality of temperature sensors; a selection part configured to select at least one temperature sensor including a temperature sensor having a smallest Mahalanobis distance, among the plurality of temperature sensors; and a controller configured to control a temperature of the inspection object using temperature data measured by the selected at least one temperature sensor.

7 Claims, 11 Drawing Sheets

INSPECTION APPARATUS, CONTROL METHOD, AND STORAGE MEDIUM

CROSS-REFERENCE TO RELATED APPLICATION

This application is based upon and claims the benefit of priority from Japanese Patent Application No. 2021-006267, filed on Jan. 19, 2021, the entire contents of which are incorporated herein by reference.

TECHNICAL FIELD

The present disclosure relates to an inspection apparatus, a control method, and a non-transitory computer-readable storage medium storing a control program.

BACKGROUND

In general, inspection of the electrical characteristics of an electronic device (an inspection object) is performed using a predetermined inspection apparatus. Specifically, the inspection is performed by fixing a wafer on which an electronic device is arranged to a stage (a chuck) and supplying electric power from a tester to the electronic device via a probe or the like.

Here, the inspection apparatus performs a temperature control with respect to the electronic device using a temperature regulator arranged inside the stage at the time of inspection. In this case, for example, the inspection apparatus performs the temperature control using a temperature sensor which is positioned closest to the position of the electronic device to be inspected from a plurality of temperature sensors.

For example, in a case in which a plurality of electronic devices are arranged on the wafer, the temperature sensor positioned closest to the position of the electronic device refers to a temperature sensor having the shortest physical distance from a position specified by the average value (that is, an average vector) of coordinates indicating the positions of respective electronic devices.

However, in a case in which a plurality of electronic devices are arranged on the wafer in an uneven distribution, a temperature sensor positioned closest to any specific electronic device may not be a suitable temperature sensor for performing temperature control.

PRIOR ART DOCUMENT

Patent Document

Patent Document 1: Japanese Laid-Open Patent Publication No. 2009-21311

SUMMARY

According to one embodiment of the present disclosure, there is provided an inspection apparatus includes: an acquisition part configured to acquire first coordinate information indicating a position of an inspection object on a stage and a plurality of pieces of second coordinate information indicating positions of a plurality of temperature sensors on the stage when performing an inspection of the inspection object; a calculation part configured to calculate a Mahalanobis distance between a position specified by an average vector of the first coordinate information and the positions of the plurality of temperature sensors; a selection part configured to select at least one temperature sensor including a temperature sensor having a smallest Mahalanobis distance, among the plurality of temperature sensors; and a controller configured to control a temperature of the inspection object using temperature data measured by the selected at least one temperature sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, each embodiment will be described with reference to the accompanying drawings. In addition, in the specification and drawings, constituent elements having substantially the same functional configurations will be denoted by the same reference numerals to omit redundant descriptions. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

<Configuration Example of Inspection Apparatus>

Figure 1:
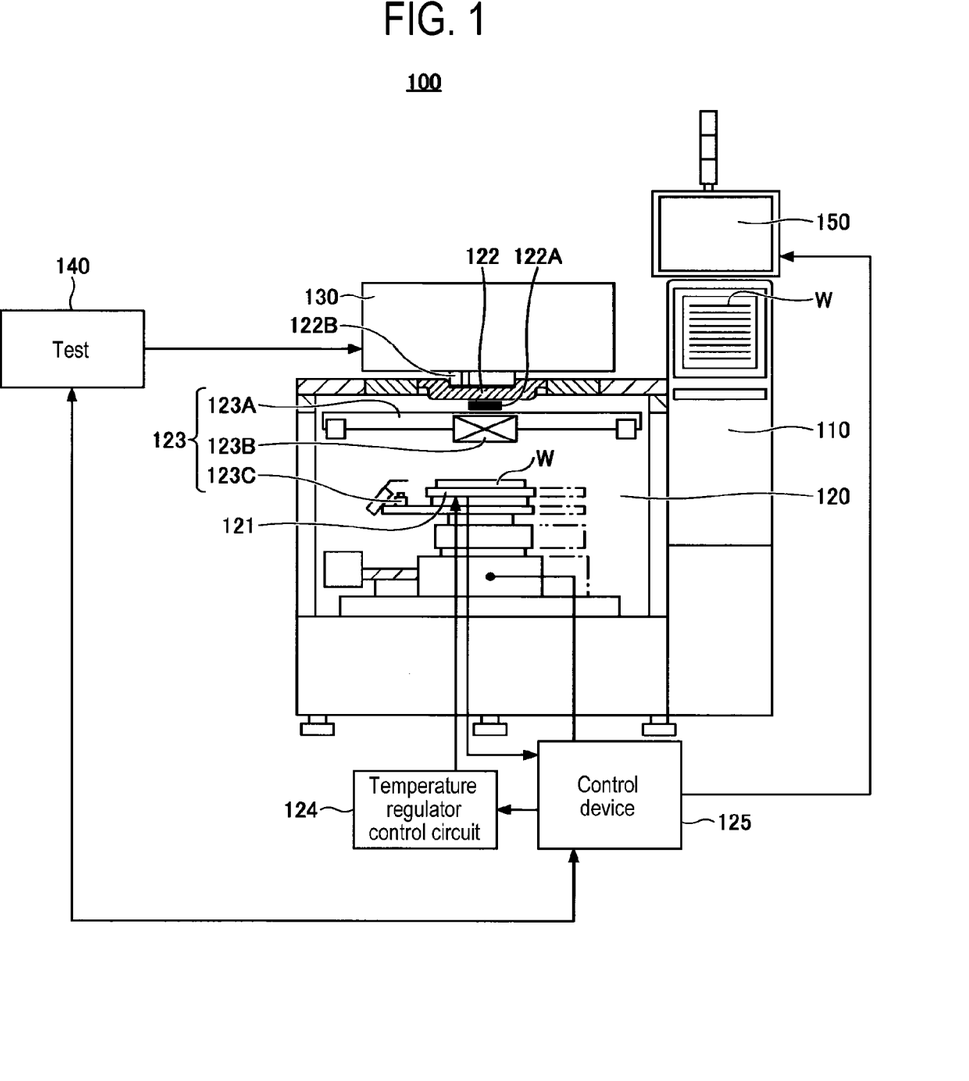
FIG. 1 is a schematic cross-sectional view illustrating a configuration example of an inspection apparatus.

First, a configuration example of an inspection apparatus according to a first embodiment will be described. FIG. 1 is a schematic cross-sectional view illustrating the configuration example of the inspection apparatus. As illustrated in FIG. 1, an inspection apparatus 100 includes a loader chamber 110, an accommodation chamber 120, a test head 130, a tester 140, and a display device 150.

The loader chamber 110 includes a mechanism configured to take out a wafer W accommodated in a transfer container and transfer the same to the accommodation chamber 120. In addition, the loader chamber 110 includes a mechanism configured to receive a wafer W for which inspection for the electrical characteristics of an electronic device has been completed and accommodate the same in the transfer container.

The accommodation chamber 120 includes a main chuck 121, a probe card 122, an alignment mechanism 123, a temperature regulator control circuit 124, and a control device 125.

The main chuck 121 is an example of a stage, and is configured to fix the wafer W and move the wafer W in a horizontal direction and a vertical direction to adjust a relative position between the probe card 122 and the wafer W. As a result, the main chuck 121 may bring the electrodes of an electronic device arranged on the wafer W into contact with a probe group 122A of the probe card 122.

The probe card 122 is arranged above the main chuck 121 and electrically connected to the test head 130 via an interface 122B. The probe group 122A supplies electric power from the test head 130 to the electronic device via the interface 122B by coming into contact with the electrodes of the electronic device arranged on the wafer W. In addition, the electronic device transmits a signal to the test head 130 via the interface 122B in response to the electric power supplied thereto.

The alignment mechanism 123 acquires data for alignment adjustment between the probe group 122A of the probe card 122 and the electrode pads of the electronic device on the wafer W fixed to the main chuck 121.

Specifically, the alignment mechanism 123 includes an alignment bridge 123A configured to move horizontally in a space between a rear surface in the accommodation chamber 120 and the probe center, and a first capturing device 123B provided on the alignment bridge 123A.

Of these, the first capturing device 123B moves to a position between the probe card 122 and the main chuck 121 by advancing from the rear surface of the accommodation chamber 120 to the probe center via the alignment bridge 123A. At the position, the first capturing device 123B detects the positions of the electrodes of the electronic device arranged on the wafer W while the main chuck 121 moves in the horizontal direction.

The alignment mechanism 123 includes a second capturing device 123C. The second capturing device 123C detects a position of the probe group 122A from below the probe card 122 while the main chuck 121 moves in the horizontal direction below the probe card 122 after the alignment bridge 123A is retracted to the rear surface in the accommodation chamber 120.

The temperature regulator control circuit 124 operates a temperature regulator (not illustrated) provided within the main chuck 121 in order to perform a high temperature inspection or a low temperature inspection on the electronic device of the wafer W. As a result, the electronic device of the wafer W fixed to the main chuck 121 is heated or cooled within an allowable range of a set target temperature. A plurality of temperature sensors (not illustrated) are provided within the main chuck 121, and temperature data measured by any of the selected temperature sensors among the plurality of temperature sensors is used as temperature data of the electronic device arranged on the wafer W.

The control device 125 performs temperature control of the electronic device of the wafer W fixed to the main chuck 121, movement control of the main chuck 121 in the horizontal and vertical directions, movement control of the alignment mechanism 123, and the like.

The test head 130 is connected to the tester 140. The tester 140 includes a test board that reproduces a portion of a circuit configuration of a motherboard on which an electronic device is arranged. The test board is connected to the control device 125 configured to determine a quality of the electronic device a signal from the electronic device. By replacing the test board in the tester 140, it is possible to reproduce circuit configurations of a plurality of types of motherboards.

The display device 150 is configured to display various data including a set target temperature, image data captured by the first and second capturing devices 123B and 123C, and the like.

<Hardware Configuration of Control Device>

Figure 2:
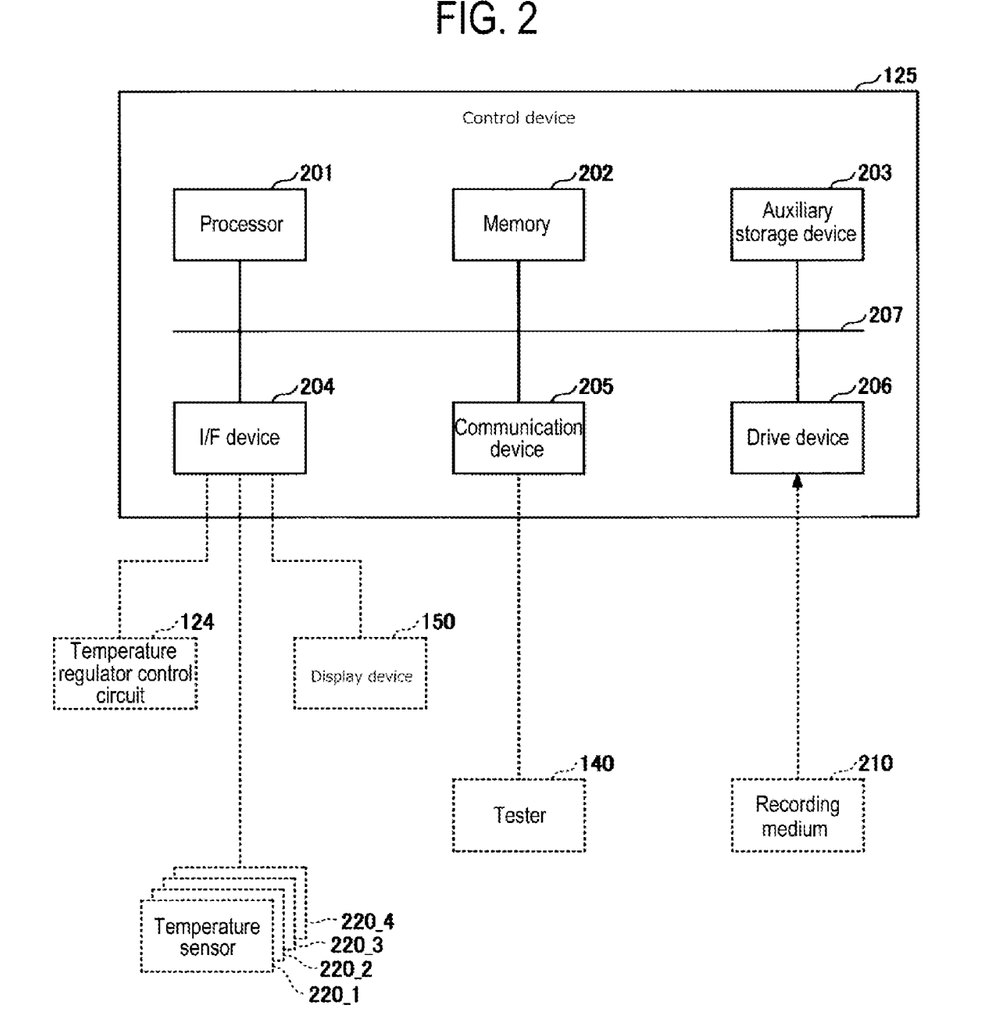
FIG. 2 is a view illustrating an example of a hardware configuration of a control device.

Next, a hardware configuration of the control device 125 will be described. FIG. 2 is a view illustrating an example of the configuration of the control device 125.

As illustrated in FIG. 2, the control device 125 includes a processor 201, a memory 202, an auxiliary storage device 203, an interface (I/F) device 204, a communication device 205, and a drive device 206. In addition, respective hardware components of the control device 125 are connected to each other via a bus 207.

The processor 201 includes various arithmetic operation devices such as a central processing unit (CPU). The processor 201 reads various programs (e.g., a control program to be described later, or the like) onto the memory 202 and executes the programs.

The memory 202 includes a main storage device such as a read only memory (ROM), a random access memory (RAM), or the like. The processor 201 and the memory 202 constitute a so-called computer. When the processor 201 executes various programs read by the processor 201 on the memory 202, the computer implements various functions.

The auxiliary storage device 203 stores various programs and various data used when various programs are executed by the processor 201.

The I/F device 204 connects the temperature regulator control circuit 124, which is an example of an external device, a plurality of temperature sensors (here, temperature sensors 220_1 to 220_4 are exemplified), a display device 150, and the like, to the control device 125.

The communication device 205 is a communication device for communicating with the tester 140.

The drive device 206 is a device configured to set a recording medium 210. Here, the "recording medium 210" includes a non-transitory computer-readable medium for optically, electrically, or magnetically recording information, such as a CD-ROM, a flexible disk, or a magneto-optical disk. In addition, the recording medium 210 may include, for example, a semiconductor memory that electrically records information, such as, a ROM or a flash memory.

In addition, the various programs to be installed in the auxiliary storage device 203 are installed, for example, by setting a distributed recording medium 210 into the drive device 206 and reading out, by the drive device 206, the various programs recorded in the recording medium 210. Alternatively, the various programs to be installed in the auxiliary storage device 203 may be installed by being downloaded from a network via the communication device 205.

<Configuration Related to Temperature Control Function>

Figure 3:
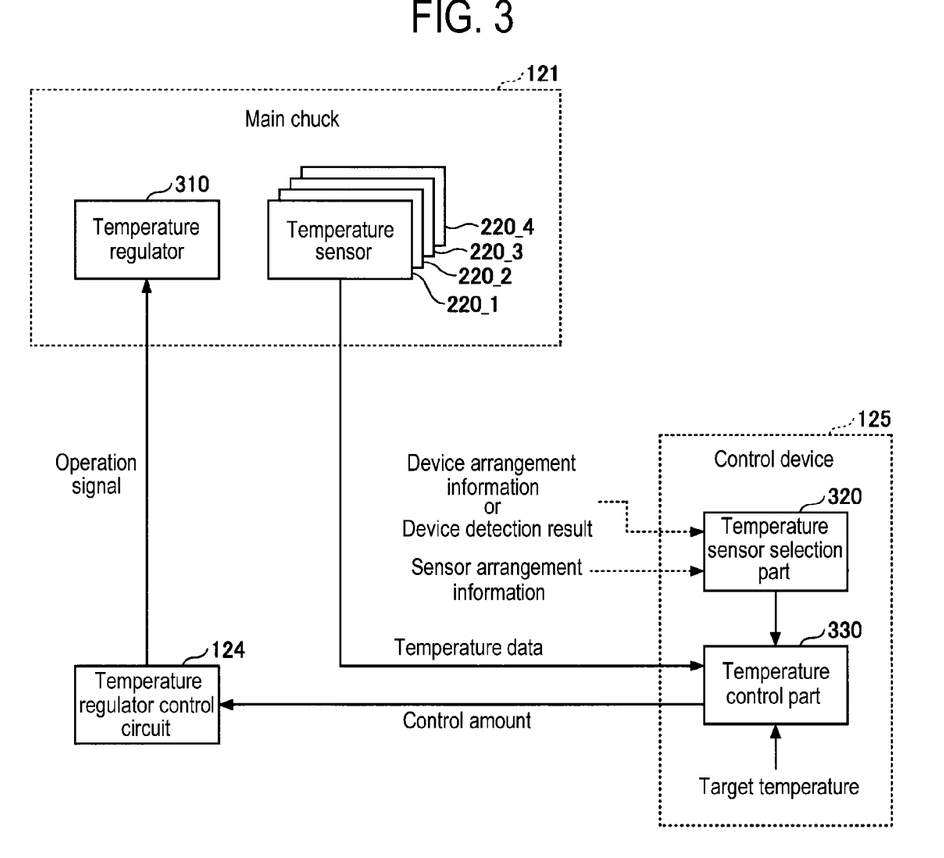
FIG. 3 is a view illustrating details of a configuration related to a temperature control function among respective configurations of the inspection apparatus.

Next, among respective configuration of the inspection apparatus 100, a configuration related to the temperature control function that controls the temperature of an electronic device at the time of inspection will be described. FIG. 3 is a view illustrating a configuration related to the temperature control function among respective configurations of the inspection apparatus.

As illustrated in FIG. 3, the configuration related to the temperature control function in the inspection apparatus 100 includes:

a temperature regulator 310 and the temperature sensors 220_1 to 220_4 which are installed in the main chuck 121;

the temperature regulator control circuit 124; and the temperature sensor selection part 320 and a temperature controller 330, which are implemented in the control device 125.

A control program is installed in the control device 125. When the program is executed, the control device 125 functions at least as the temperature sensor selection part 320 and the temperature controller 330.

As illustrated in FIG. 3, when a target temperature is set in the temperature controller 330 and the temperature control is started, the temperature controller 330 calculates a control amount according to the set target temperature and transmits the control amount to the temperature regulator control circuit 124. The temperature regulator control circuit 124 transmits an operation signal according to the control amount received from the temperature controller 330 to the temperature regulator 310 to operate the temperature regulator 310.

When the temperature of the main chuck 121 changes due to the operation of the temperature regulator 310, the temperature sensors 220_1 to 220_4 detect the temperature change and feedback temperature data to the temperature controller 330.

The temperature controller 330 acquires temperature data from the temperature sensor selected in advance by the temperature sensor selection part 320 among the temperature data fed back from the temperature sensors 220_1 to 220_4, and calculates a difference between the temperature data and the target temperature. In addition, the temperature controller 330 calculates a control amount according to the calculated difference (according to the difference, a differential value of the difference, and an integrated value of the difference), and transmits the same to the temperature regulator control circuit 124.

In this way, the temperature controller 330 feeds back the temperature data and performs the temperature control of the electronic device through PID control.

The temperature sensor selection part 320 selects in advance a temperature sensor adapted for temperature control based on the "number and positions of electronic devices to be inspected" and the "positions of the temperature sensors 220_1 to 220_4", and notify the temperature controller 330 of information relating to the selected temperature sensor.

Of these, the number and positions of the electronic devices to be inspected are acquired, for example, by receiving, by the control device 125, device arrangement information in advance and reading, by the temperature sensor selection part 320, the device arrangement information. Alternatively, when a capturing device configured to detect an electronic device is installed in the accommodation chamber 120, the number and positions of electronic devices may be acquired based on an image captured by the capturing device (a device detection result). The positions of the temperature sensors 220_1 to 220_4 are acquired by reading, by the temperature sensor selection part 320, sensor arrangement information previously held by the inspection apparatus 100.

<Positional Relationship Between Electronic Device to be Inspected and Temperature Sensor During Inspection>

Next, the positional relationship between an electronic device to be inspected and a temperature sensor at the time of inspection will be described. FIGS. 4A to 4D are views illustrating examples of positional relationships between electronic devices and temperature sensors at the time of inspection, illustrating positional relationships between electronic devices arranged on a wafer W and temperature sensors, when viewed from above, in the state in which the wafer W is fixed to the main chuck 121 at the time of inspection.

Figure 4A:
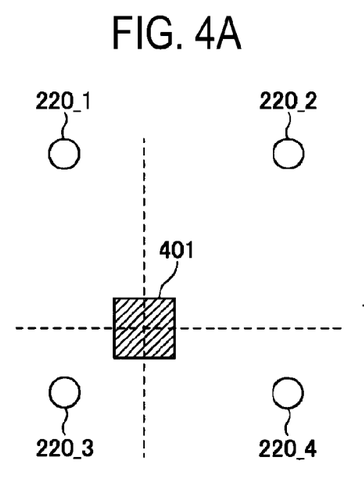
FIGS. 4A to 4C are views illustrating examples of positional relationships between electronic devices and temperature sensors at the time of inspection.

Among these, the example of FIG. 4A illustrates a positional relationship between four temperature sensors 220_1 to 220_4 and one electronic device 401 to be inspected. In FIG. 4A, the dotted lines represent a vertical average value and a horizontal average value of coordinates indicating the position of the electronic device 401. Therefore, in FIG. 4A, the intersection of the dotted lines is an average vector of the electronic device 401.

Figure 4B:
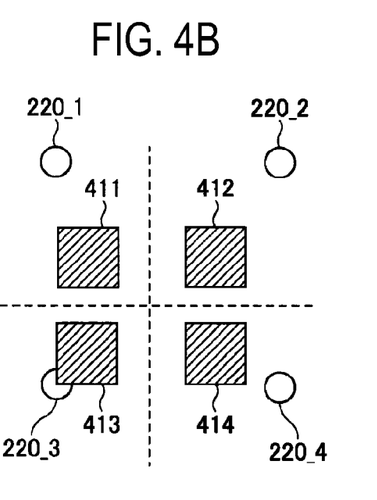

The example of FIG. 4B illustrates a positional relationship between four temperature sensors 220_1 to 220_4 and four electronic devices 414 to be inspected. In FIG. 4B, the dotted lines represent a vertical average value and a horizontal average value of coordinates indicating the positions of respective electronic devices 411 to 414. Therefore, in FIG. 4B, the intersection of the dotted lines is an average vector of the electronic devices 411 to 414.

Figure 4C:
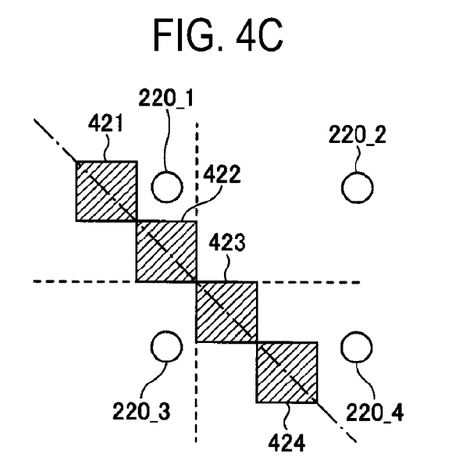

The example of FIG. 4C illustrates a positional relationship between four temperature sensors 220_1 to 220_4 and four electronic devices 421 to 424 to be inspected. In FIG. 4C, the dotted lines represent a vertical average value and a horizontal average value of coordinates indicating the positions of respective electronic devices 421 to 424. Therefore, in FIG. 4C, the intersection of the dotted lines is an average vector of the electronic devices 421 to 424.

As described above, since the number and positions (i.e., distribution) of electronic devices to be inspected vary, and the positional relationship with the temperature sensors 220_1 to 220_4 also changes depending on the number and positions (distribution) of the electronic devices to be inspected.

Therefore, for example, as in the example of FIG. 4C, when four electronic devices 421 to 424 are arranged in a distribution biased from diagonally upper left to diagonally lower right, it cannot be said that the temperature sensor positioned closest to the average vector is always the appropriate temperature sensor for temperature control.

In the example of FIG. 4C, the temperature sensor closest to the position specified by the average vector (the position of the intersection of the dotted lines) is the temperature sensor 220_3, but the temperature closest to the alternated long and short dash line directed from diagonally upper left to diagonally lower right is the temperature sensor 220_1.

Here, in order to perform appropriate temperature control for the electronic devices, it is necessary to use typical temperature data for the electronic devices to be inspected. Therefore, as described above, under the situation in which the positional relationships with the temperature sensors 220_1 to 220_4 change depending on the distribution of the electronic devices to be inspected, it is necessary to select the temperature sensor capable of measuring the typical temperature data according to the distribution. That is, in the example of FIG. 4C, it is desirable to select the temperature sensor 220_1 instead of the temperature sensor 220_3 to perform temperature control.

For this reason, the control device 125 of the present embodiment is configured to select a temperature sensor according to the number and positions (distribution) of electronic devices to be inspected.

<Functional Configuration of Temperature Sensor Selection Part>

Figure 5:
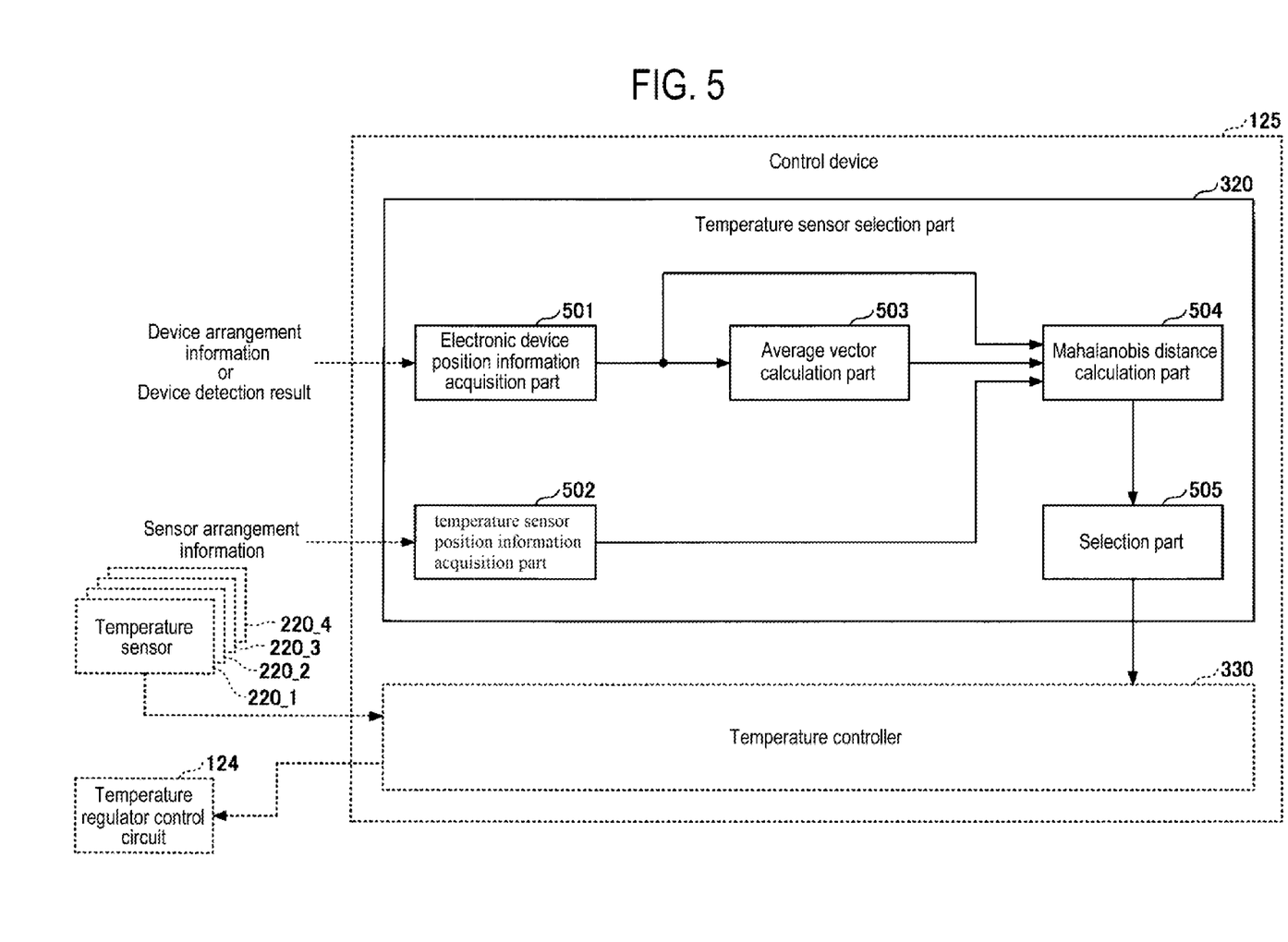
FIG. 5 is a view illustrating an example of a functional configuration of a temperature sensor selection part of the control device.

Next, among the functions implemented by executing the control program in the control device 125, the functions of the temperature sensor selection part will be described. FIG. 5 is a view illustrating an example of a functional configuration of the temperature sensor selection part of the control device. As illustrated in FIG. 5, the temperature sensor selection part 320 includes an electronic device position information acquisition part 501, a temperature sensor position information acquisition part 502, an average vector calculation part 503, a Mahalanobis distance calculation part 504, and a selection part 505.

The electronic device position information acquisition part 501 is an example of an acquisition part, and is configured to acquire coordinates (first coordinate information) indicating the position of an electronic device to be inspected and notify the average vector calculation part 503 and the Mahalanobis distance calculation part 504 of the acquired coordinates. The electronic device position information acquisition part 501 is configured to acquire the coordinates of respective vertices of an electronic device to be inspected (coordinates of four points).

Specifically, when there is one electronic device to be inspected, the electronic device position information acquisition part 501 acquires the coordinates of four points. When there are four electronic devices to be inspected, the electronic device position information acquisition part 501 acquires the coordinates of 16 points.

The temperature sensor position information acquisition part 502 is an example of the acquisition part, and is configured to acquire coordinates indicating the position of a temperature sensor (second coordinate information) and notify the Mahalanobis distance calculation part 504 of the acquired coordinates. The temperature sensor position information acquisition part 502 is configured to acquire the coordinates of the center points of respective temperature sensors.

Specifically, when there are four temperature sensors, the temperature sensor position information acquisition part 502 acquires the coordinates of four points.

The average vector calculation part 503 is configured to calculate an average vector (an average value of respective coordinates) from the coordinates indicating the positions of the electronic devices to be inspected and notify the Mahalanobis distance calculation part 504 of the calculated average vector. For example, when there is one electronic device to be inspected, the average vector of the electronic device to be inspected is calculated based on the average value of the coordinates of respective vertices of the electronic device (the coordinates of four points). In addition, for example, when there are four electronic devices to be inspected, the average vector of the electronic device to be inspected is calculated based on the average value of the coordinates of respective vertices of the electronic devices (the coordinates of sixteen points).

The Mahalanobis distance calculation part 504 is an example of a calculation part, and is configured to calculate a Mahalanobis distance between the position specified by an average vector of an electronic device to be inspected and the position of each temperature sensor based on the following:

the coordinates indicating the position of the electronic device to be inspected, notified from the electronic device position information acquisition part 501;

the average vector of the electronic device to be inspected notified from the average vector calculation part 503; and the coordinates indicating the positions of temperature sensors, notified from the temperature sensor position information acquisition part 502.

The Mahalanobis distance calculation part 504 is further configured to notify the selection part 505 of the calculated Mahalanobis distances from the positions of respective temperature sensors.

The selection part 505 selects a temperature sensor having the minimum Mahalanobis distance temperature among the Mahalanobis distances from the positions of respective temperature sensors, notified from the Mahalanobis distance calculation part 504, and notifies the temperature controller 330 of the selected temperature sensor.

By calculating the Mahalanobis distances in this way, it is possible to select a temperature sensor according to the number and positions (distribution) of electronic devices to be inspected. As a result, the temperature controller 330 can perform temperature control of electronic devices to be inspected using an appropriate temperature sensor.

<Specific Example of Processing Performed by Temperature Sensor Selection Part>

Figure 6A:
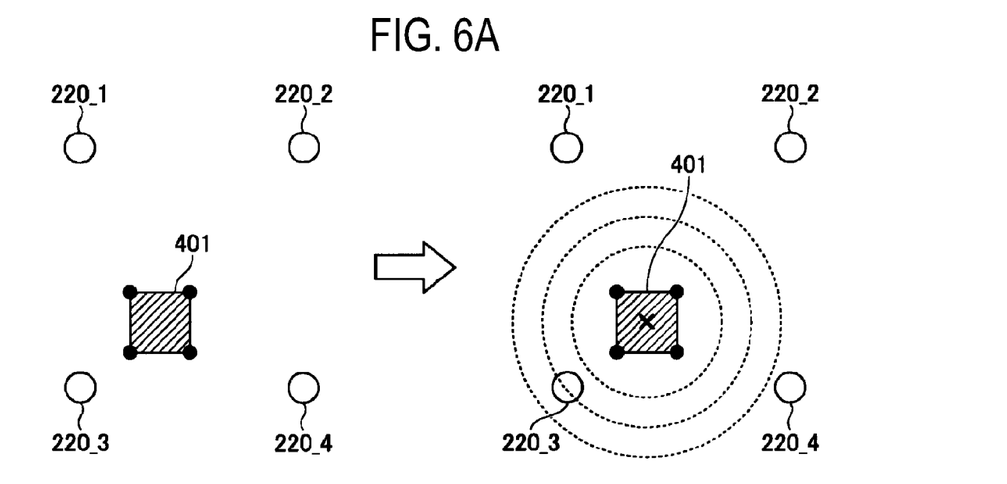
FIGS. 6A to 6C are views illustrating specific examples of processing performed by the temperature sensor selection part.
Figure 6B:
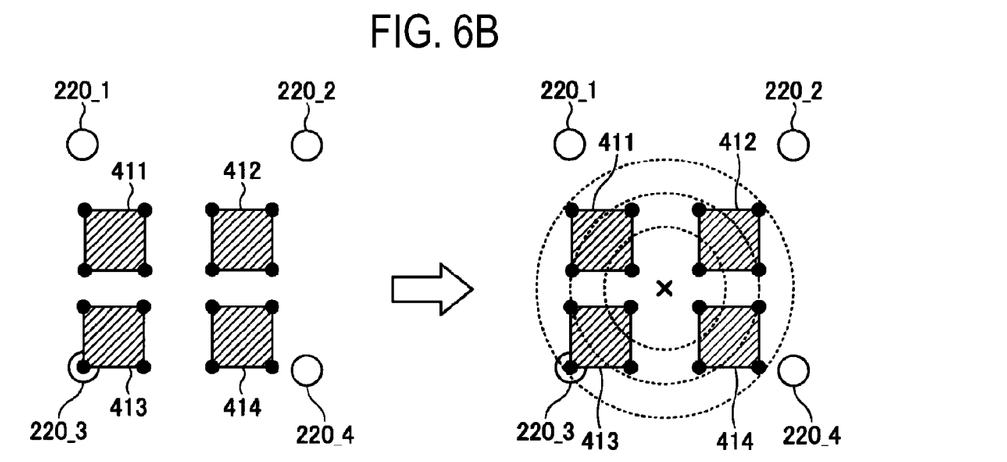
Figure 6C:
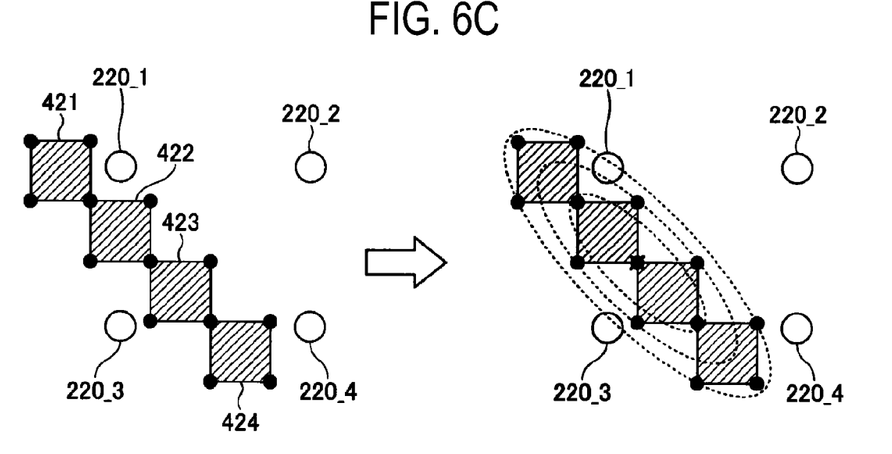

Next, a specific example of processing performed by the temperature sensor selection part 320 will be described. FIGS. 6A to 6C are views illustrating specific examples of processing performed by the temperature sensor selection part, in which specific examples of processing in the case in which the temperature sensor selection part 320 selects one temperature with respect to each positional relationship between the electronic devices and the temperature sensors illustrated in FIGS. 4A to 4C.

As illustrated in FIG. 6A, the electronic device position information acquisition part 501 acquires coordinates indicating the position of an electronic device 401 (see four black circles). The average vector calculation part 503 calculates an average vector (see a mark X) from the coordinates indicating the position of the electronic device 401. The Mahalanobis distance calculation part 504 calculates the Mahalanobis distances between the position specified by the average vector of the electronic device 401 and the positions of four respective temperature sensors 220_1 to 220_4. In FIG. 6A, the plurality of dotted concentric circles indicate positions at which the Mahalanobis distances are equal when viewed from the position specified by the average vector of the electronic device 401.

According to the example of FIG. 6A, the selection part 505 selects the temperature sensor 220_3 having the smallest Mahalanobis distance from the position specified by the average vector of the electronic device 401. As described above, according to the temperature sensor selection part 320, an appropriate temperature sensor can be selected even when only one electronic device to be inspected is arranged.

As illustrated in FIG. 6B, the electronic device position information acquisition part 501 acquires coordinates indicating the positions of electronic devices 411 to 414 (see sixteen black circles). The average vector calculation part 503 calculates an average vector (see a mark X) from the coordinates indicating the positions of the electronic devices 411 to 414. The Mahalanobis distance calculation part 504 calculates the Mahalanobis distances between the position specified by the average vector of the electronic devices 411 to 414 and the positions of four respective temperature sensors 220_1 to 220_4. In FIG. 6B, the plurality of dotted concentric circles indicate positions at which the Mahalanobis distances are equal when viewed from the position specified by the average vector of the electronic devices 411 to 414.

According to the example of FIG. 6B, the selection part 505 selects the temperature sensor 220_3 having the smallest Mahalanobis distance from the position specified by the average vector of the electronic devices 411 to 414. As described above, according to the temperature sensor selection part 320, an appropriate temperature sensor can be selected even when a plurality of electronic devices to be inspected are arranged in an even distribution.

As illustrated in FIG. 6C, the electronic device position information acquisition part 501 acquires coordinates indicating the positions of electronic devices 421 to 424 (see sixteen black circles). The average vector calculation part 503 calculates an average vector (see a mark X) from the coordinates indicating the positions of the electronic devices 421 to 424. The Mahalanobis distance calculation part 504 calculates the Mahalanobis distances between the position specified by the average vector of the electronic devices 421 to 424 and the positions of four respective temperature sensors 220_1 to 220_4. In FIG. 6C, the plurality of dotted concentric ellipses indicate positions at which the Mahalanobis distances are equal when viewed from the position specified by the average vector of the electronic devices 421 to 424.

According to the example of FIG. 6C, the selection part 505 selects the temperature sensor 220_1 having the smallest Mahalanobis distance from the position specified by the average vector of the electronic devices 421 to 424. As described above, according to the temperature sensor selection part 320, an appropriate temperature sensor can be selected even when a plurality of electronic devices to be inspected are arranged in an uneven distribution.

<Details of Processing by Mahalanobis Distance Calculation Part>

Figure 7:
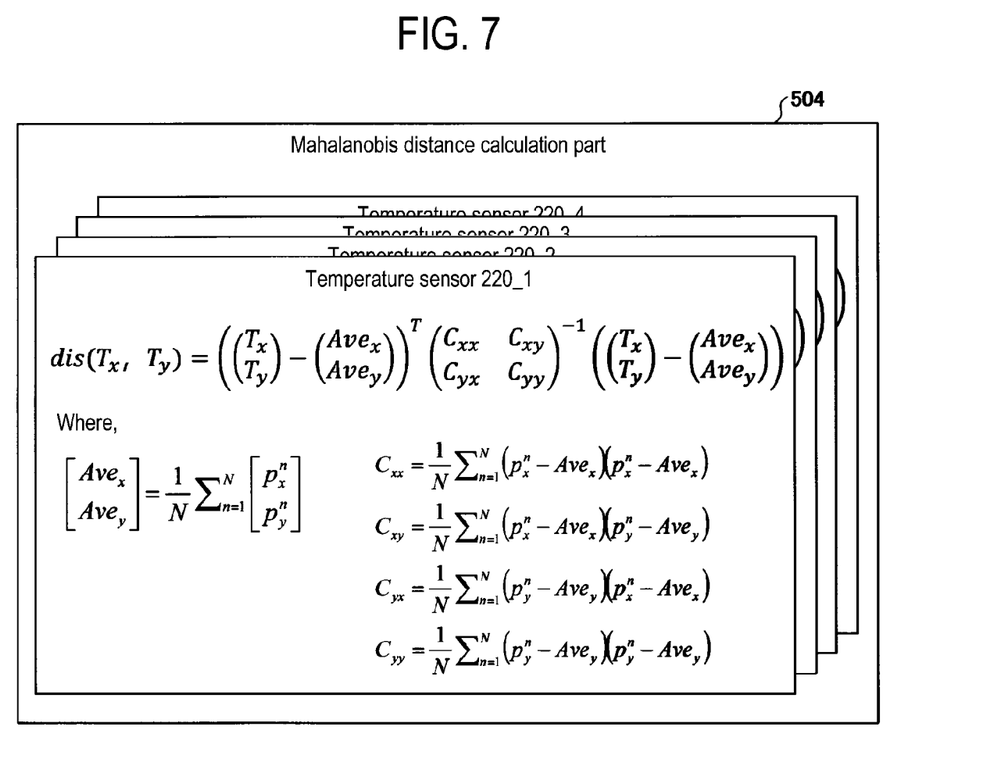
FIG. 7 is a view illustrating details of processing performed by a Mahalanobis distance calculation part.

Next, the details of processing performed by the Mahalanobis distance calculation part 504 when calculating the Mahalanobis distance between the position specified by the average vector of an electronic device and the position of each of the temperature sensors 220_1 to 220_4 will be described. FIG. 7 is a view illustrating details of processing performed by the Mahalanobis distance calculation part.

As illustrated in FIG. 7, the Mahalanobis distance (dis(Tx, Ty)) from the temperature sensor 220_1 is calculated based on, for example, Equation 1 below.

$$dis(T_x, T_y) = \left(\begin{pmatrix} T_x \\ T_y \end{pmatrix} - \begin{pmatrix} Ave_x \\ Ave_y \end{pmatrix}\right)^T \begin{pmatrix} C_{xx} & C_{xy} \\ C_{yx} & C_{yy} \end{pmatrix}^{-1} \left(\begin{pmatrix} T_x \\ T_y \end{pmatrix} - \begin{pmatrix} Ave_x \\ Ave_y \end{pmatrix}\right)$$ [Equation 1]

where $$\begin{bmatrix} Ave_x \\ Ave_y \end{bmatrix} = \frac{1}{N}\sum_{n=1}^{N} \begin{bmatrix} p_x^n \\ p_y^n \end{bmatrix}$$

$$C_{xx} = \frac{1}{N}\sum_{n=1}^{N} (p_x^n - Ave_x)(p_x^n - Ave_x)$$

$$C_{xy} = \frac{1}{N}\sum_{n=1}^{N} (p_x^n - Ave_x)(p_y^n - Ave_y)$$

$$C_{yx} = \frac{1}{N}\sum_{n=1}^{N} (p_n^y - Ave_y)(p_x^n - Ave_x)$$

$$C_{yy} = \frac{1}{N}\sum_{n=1}^{N} (p_y^n - Ave_y)(p_y^n - Ave_y)$$

In Equation 1 above, $p''_x$ represents an x-coordinate indicating the position of the $n_{th}$ (here, n=1) temperature sensor 220_1, and $p''_y$ represents a y-coordinate indicating the position of the $n_{th}$ (here, n=1) temperature sensor 220_1. $Ave_x$ represents an x-coordinate of an average vector of an electronic device to be inspected, and $Ave_y$ represents a y-coordinate of the average vector of the electronic device to be inspected. In addition, N represents the number of coordinates indicating the position of the electronic device to be inspected. For example, when the number of electronic devices to be inspected is one, N=4, and when the number is four, N=16.

Similarly, the Mahalanobis distance calculation part 504 calculates the Mahalanobis distances (dis(Tx, Ty)) for the temperature sensors 220_2 to 220_4 based on Equation 1 above.

<Flow of Inspection Processing>

Figure 8A:
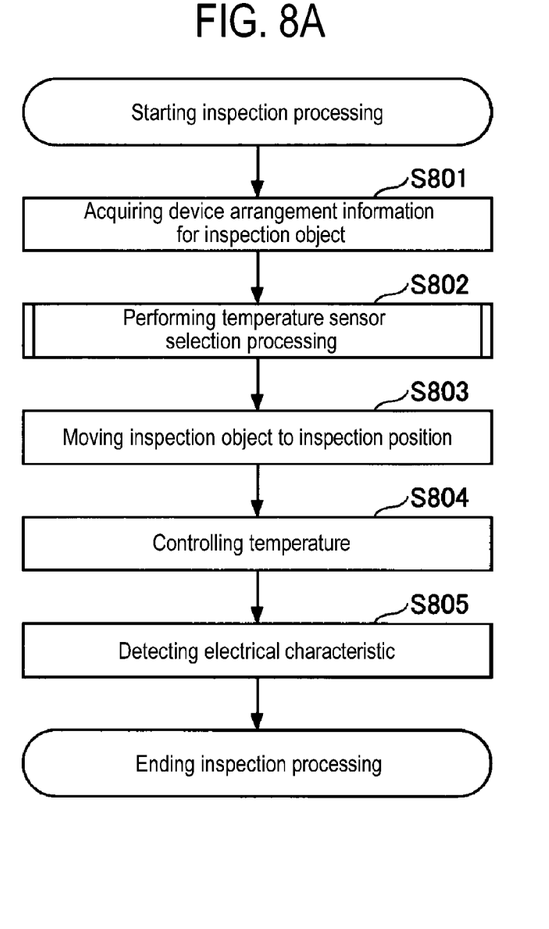
FIGS. 8A and 8B are flowcharts illustrating a flow of inspection processing in the inspection apparatus.
Figure 8B:
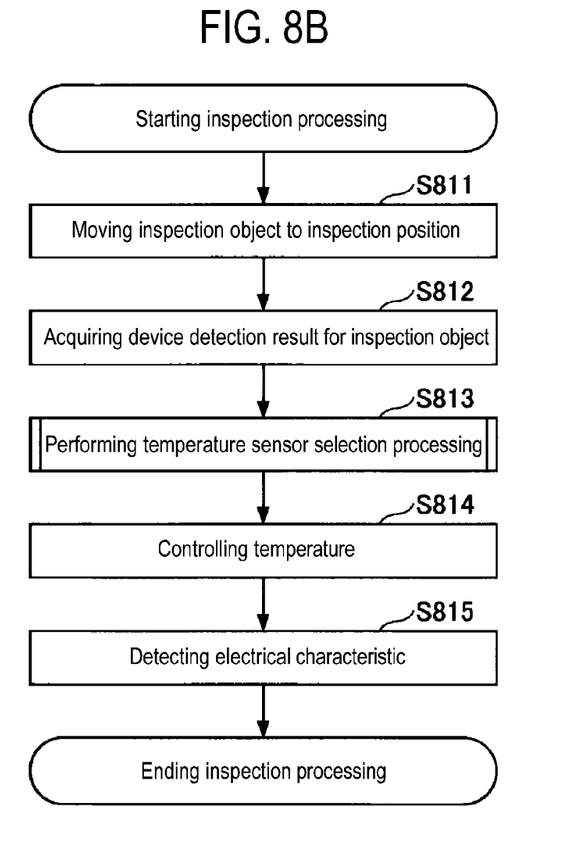

Next, a flow of inspection processing in the inspection apparatus 100 will be described. FIGS. 8A and 8B are flowcharts illustrating a flow of inspection processing in the inspection apparatus. Of these, FIG. 8A illustrates a flow of inspection processing when the number and positions of electronic devices to be inspected are acquired by reading out device arrangement information.

In step S801, the inspection apparatus 100 reads device arrangement information of electronic devices to be inspected, and acquires the number and positions of the electronic devices to be inspected.

In step S802, the inspection apparatus 100 performs temperature sensor selection processing and selects a temperature sensor according to the number and positions of the electronic devices to be inspected. Details of the temperature sensor selection processing will be described later.

In step S803, the inspection apparatus 100 moves a wafer W on which electronic devices to be inspected are arranged to an inspection position.

In step S804, the inspection apparatus 100 performs temperature control of a main chuck using temperature data measured by the temperature sensor selected in step S802.

In step S805, the inspection apparatus 100 performs an inspection about the electrical characteristics of the electronic devices to be inspected.

In this way, when the number and positions of the electronic devices to be inspected are acquired by reading the device arrangement information, the temperature sensor selection processing may be executed before moving the wafer W on which the electronic devices to be inspected are arranged to the inspection position.

Meanwhile, FIG. 8B illustrates a flow of inspection processing when acquiring the number and positions of electronic devices to be inspected based on a device detection result.

In step S811, the inspection apparatus 100 moves the wafer W on which the electronic devices to be inspected are arranged to the inspection position.

In step S812, the inspection apparatus 100 acquires the number and positions of the electronic devices to be inspected based on the device detection result obtained by capturing the electronic devices to be inspected.

In step S813, the inspection apparatus 100 performs temperature sensor selection processing and selects a temperature sensor according to the number and positions of the electronic devices to be inspected. Details of the temperature sensor selection processing will be described later.

In step S814, the inspection apparatus 100 performs temperature control of a main chuck using temperature data measured by the temperature sensor selected in step S813.

In step S815, the inspection apparatus 100 performs an inspection about the electrical characteristics of the electronic devices to be inspected.

In this way, when the number and positions of the electronic devices to be inspected are acquired based on the device detection result, the temperature sensor selection processing may be executed after moving the wafer W on which the electronic devices to be inspected are arranged to the inspection position. This makes it possible to select an appropriate temperature sensor even when an inspection of electronic devices is performed for the number or positions different from those of the device arrangement information acquired in advance.

A case in which an inspection is performed for the number or positions different from those of the device placement information acquired in advance may include, for example, a case in which, after completion of a first round of inspection, a second round of inspection is performed except for the electronic devices determined to be good, or the like.

<Flow of Temperature Sensor Selection Processing Performed by Temperature Sensor Selection Part>

Figure 9:
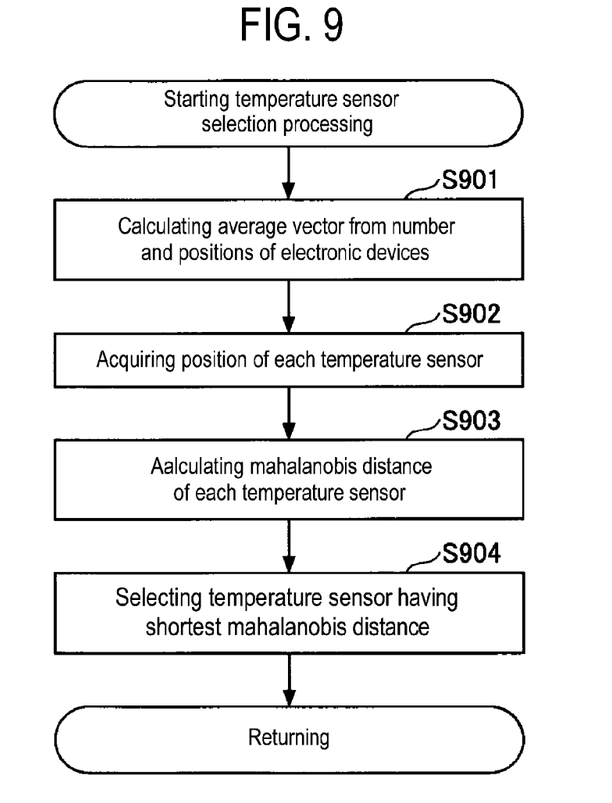
FIG. 9 is a flowchart illustrating a flow of temperature sensor selection processing.

Next, a flow of temperature sensor selection processing shown in steps S802 and S813 of FIGS. 8A and 8B will be described. FIG. 9 is a flowchart illustrating a flow of temperature sensor selection processing.

In step S901, the average vector calculation part 503 calculates an average vector from the number and positions of electronic devices to be inspected.

In step S902, the temperature sensor position information acquisition part 502 acquires the position of each temperature sensor.

In step S903, the Mahalanobis distance calculation part 504 calculates the Mahalanobis distance between the position specified by the average vector of the electronic device to be inspected and the position of each temperature sensor.

In step S904, the selection part 505 selects a temperature sensor having the smallest Mahalanobis distance from the position specified by the average vector of the electronic devices to be inspected.

SUMMARY

As is clear from the above description, the inspection apparatus 100 according to the first embodiment is configured to:
  acquire coordinates indicating the positions of the electronic devices in the main chuck and coordinates indicating the positions of the plurality of temperature sensors in the main chuck at the time of inspecting the electrical characteristics of the electronic devices;
  calculate the average vector from the coordinates indicating the positions of the electronic devices in the main chuck and calculate the Mahalanobis distance between the position specified by the calculated average vector and the position of each of the plurality of temperature sensors;
  select the temperature sensor having the smallest calculated Mahalanobis distance; and
  perform the temperature control of the electronic devices using temperature data measured by the selected temperature sensor.

As described above, in the inspection apparatus according to the first embodiment, it is possible to select a temperature sensor according to a distribution of inspection objects by calculating the Mahalanobis distances from the position specified by the average vector of the inspection objects.

As a result, according to the first embodiment, when performing an inspection for inspection objects, it is possible to select an appropriate temperature sensor and perform temperature control.

Second Embodiment

Figure 10A:
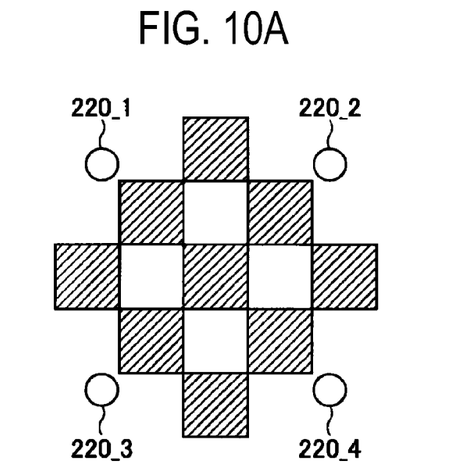
FIGS. 10A to 10C are views illustrating other examples of positional relationships between electronic devices and temperature sensors at the time of inspection.
Figure 10B:
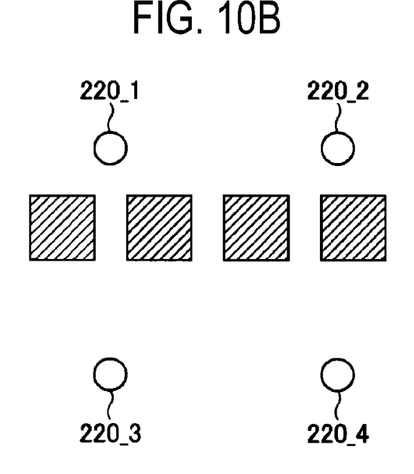
Figure 10C:
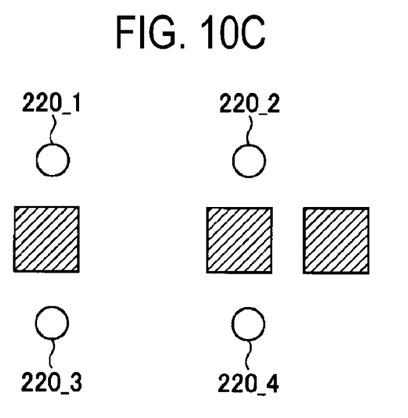

In the first embodiment described above, the case illustrated in FIGS. 4A to 4C is exemplified as positional relationships between electronic devices to be inspected and temperature sensors. However, the positional relationships between electronic devices to be inspected and temperature sensors are not limited to the case illustrated in FIGS. 4A to 4C. FIGS. 10A to 10C are views illustrating other examples of positional relationships between electronic devices and temperature sensors at the time of inspection.

Of these, FIG. 10A illustrates a case in which the number of electronic devices to be inspected is nine and respective electronic devices are arranged in a grid pattern. FIG. 10B illustrates a case in which the number of electronic devices to be inspected is four and respective electronic devices are arranged in a horizontal row. Furthermore, FIG. 10C illustrates a case in which the number of electronic devices to be inspected is three and respective electronic devices are arranged in a horizontal row in a state in which one electronic device is skipped.

Then, in any of the cases illustrated in FIGS. 10A to 10C, an appropriate temperature sensor can be selected by executing the temperature sensor selection processing described in the first embodiment to select the temperature sensor.

Third Embodiment

In each of the above embodiments, the temperature sensor having the smallest Mahalanobis distance from the position specified by the average vector of the electronic devices is selected. However, the method of selecting a temperature sensor is not limited thereto. As an example, the method may be configured to select m high-ranked temperature sensors having relatively short Mahalanobis distances (where, m is an integer of 1 or more).

In this case, temperature data measured by each of the m temperature sensors may be weighted and summed according to the calculated Mahalanobis distance.

In each of the above-described embodiments, the case in which the coordinates of each vertex of an electronic device are used as the coordinates indicating the position of the electronic device has been described, but the coordinates indicating the position of the electronic device are limited to the coordinates of each vertex of the electronic device. For example, the coordinates may be coordinates of points distributed two-dimensionally on an electronic device, such as coordinates of a midpoint of each side of the electronic device.

It is possible to provide an inspection apparatus, a control method, and a non-transitory computer-readable storage medium storing a control program for selecting an appropriate temperature sensor and performing temperature control when performing an inspection of an inspection object.

The present disclosure is not limited to the configurations illustrated herein, such as combinations with other elements in the configurations exemplified in the above-described embodiments or the like. These points can be changed without departing from the gist of the present disclosure, and can be appropriately determined according to an application form thereof

What is claimed is:

1. An inspection apparatus comprising:
at least one processor; and
at least one memory configured to store instructions which, when executed by the at least one processor, cause the at least one processor to perform operations, wherein the at least one processor is configured to:
  acquire first coordinate information indicating a position of an inspection object on a stage and a plurality of pieces of second coordinate information indicating positions of a plurality of temperature sensors on the stage when performing an inspection of the inspection object;
  calculate a Mahalanobis distance between a position specified by an average vector of the first coordinate information and the positions of the plurality of temperature sensors;
  select at least one temperature sensor including a temperature sensor having a smallest Mahalanobis distance, among the plurality of temperature sensors; and
  control a temperature of the inspection object using temperature data measured by the selected at least one temperature sensor, and
wherein the at least one processor is further configured to select m high-ranked temperature sensors having relatively short Mahalanobis distances (where, m is an integer of 1 or more), among the plurality of temperature sensors.

2. The inspection apparatus of claim 1, wherein the average vector of the first coordinate information is an x-coordinate average value and a y-coordinate average value of coordinates indicating the position of the inspection object.

3. The inspection apparatus of claim 1, wherein, when the plurality of temperature sensors are selected, the at least one processor is further configured to weight and sum respective temperature data measured by the selected plurality of temperature sensors according to the Mahalanobis distance.

4. The inspection apparatus of claim 1, wherein the at least one processor is configured to acquire the first coordinate information by capturing the inspection object which has moved to an inspection position.

5. The inspection apparatus of claim 1, wherein the at least one processor is configured to acquire each vertex of the inspection object as the first coordinate information.

6. A control method comprising:
acquiring first coordinate information indicating a position of an inspection object on a stage and a plurality of pieces of second coordinate information indicating positions of a plurality of temperature sensors on the stage when performing an inspection of the inspection object;
calculating a Mahalanobis distance between a position specified by an average vector of the first coordinate information and the positions of the plurality of temperature sensors;
selecting at least one temperature sensor including a temperature sensor having a smallest Mahalanobis distance, among the plurality of temperature sensors; and
controlling a temperature of the inspection object using temperature data measured by the selected at least one temperature sensor,
wherein the selecting the at least one temperature sensor includes selecting m high-ranked temperature sensors having relatively short Mahalanobis distances (where, m is an integer of 1 or more), among the plurality of temperature sensors.

7. A non-transitory computer-readable storage medium storing a control program that causes a computer to execute:
acquiring first coordinate information indicating a position of an inspection object on a stage and a plurality of pieces of second coordinate information indicating positions of a plurality of temperature sensors on the stage when performing an inspection of the inspection object;
calculating a Mahalanobis distance between a position specified by an average vector of the first coordinate information and the positions of the plurality of temperature sensors;
selecting at least one temperature sensor including a temperature sensor having a smallest Mahalanobis distance, among the plurality of temperature sensors; and
controlling a temperature of the inspection object using temperature data measured by the selected at least one temperature sensor,
wherein the selecting the at least one temperature sensor includes selecting m high-ranked temperature sensors having relatively short Mahalanobis distances (where, m is an integer of 1 or more), among the plurality of temperature sensors.

* * * * *